HIGH POWER JUNCTION LASER STRUCTURE

Filed Feb. 19, 1964

Inventor:
Robert N. Hall,
by John F. Ahern
His Attorney.

United States Patent Office 3,359,508
Patented Dec. 19, 1967

3,359,508

HIGH POWER JUNCTION LASER STRUCTURE

Robert N. Hall, Schenectady, N.Y., assignor to General Electric Company, a corporation of New York Filed Feb. 19, 1964, Ser. No. 345,885
7 Claims. (Cl. 331—94.5)

The present invention relates to generation of stimulated coherent radiation utilizing semiconductor junction devices, and more particularly to means for increasing the power of coherent radiation obtainable from such devices.

Semiconductor diodes adapted to provide generation of stimulated coherent radiation are described in an article entitled, "Coherent Light Emission From P-N Junctions," appearing in Solid-State Electronics, vol. 6, page 405, 1963, that is intended to be incorporated herein by reference thereto. Diodes of this type are referred to herein, and in the appended claims as semiconductor junction lasers.

The discovery of the semiconductor junction laser enabled more efficient generation of stimulated coherent radiation of light, not necessarily visible but infrared as well, and also of microwave frequencies, utilizing less complex equipment. In some applications, requiring a high power coherent light source, it is desirable that oscillation is unused, or spurious, modes be prevented or reduced in intensity and that background light, or superradiance, be suppressed. Such reduction and suppression yields increased efficiency of light generation at the desired frequency of operation and permits a greater useable output power to be realized without exceeding the capacity of the device.

Accordingly, it is an object of my invention to provide a semiconductor junction laser that is capable of supplying more useful output power than heretofore known devices of this type.

It is another object of my invention to provide a semiconductor laser of increased efficiency.

Still another object of my invention is to provide a semiconductor laser wherein oscillation in spurious modes is prevented.

Briefly stated, in accord with my invention, I provide a semiconductor diode laser wherein the junction extends linearly between two parallel reflecting surfaces, resulting in standing waves that are the primary mode of oscillation. The junction is sufficiently curved in other directions so that radiation in directions not perpendicular to the parallel surfaces passes out of the junction region and into the semiconductor crystal where it is readily absorbed. In this way, radiation tending to support spurious modes of oscillation is quenched, resulting in a semiconductor junction laser wherein spurious radiation is suppressed.

Figure 1:
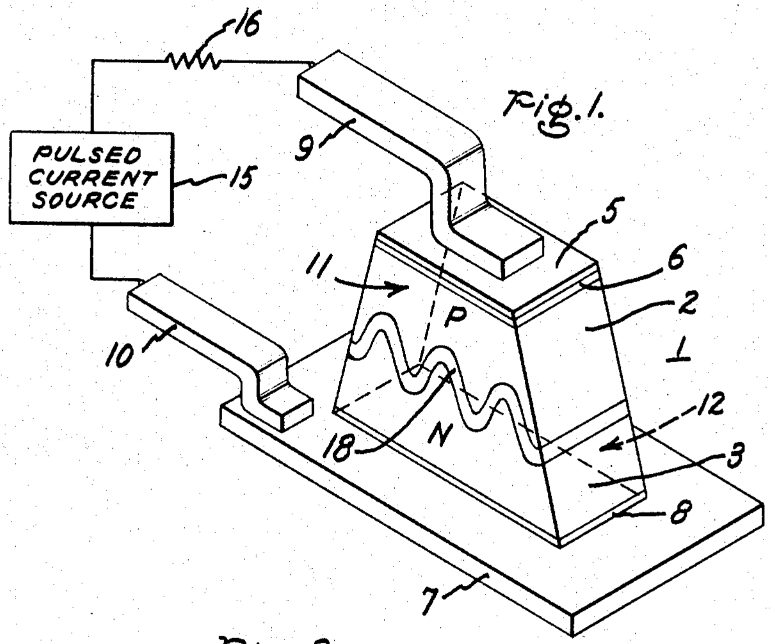
Figures 2, 3:
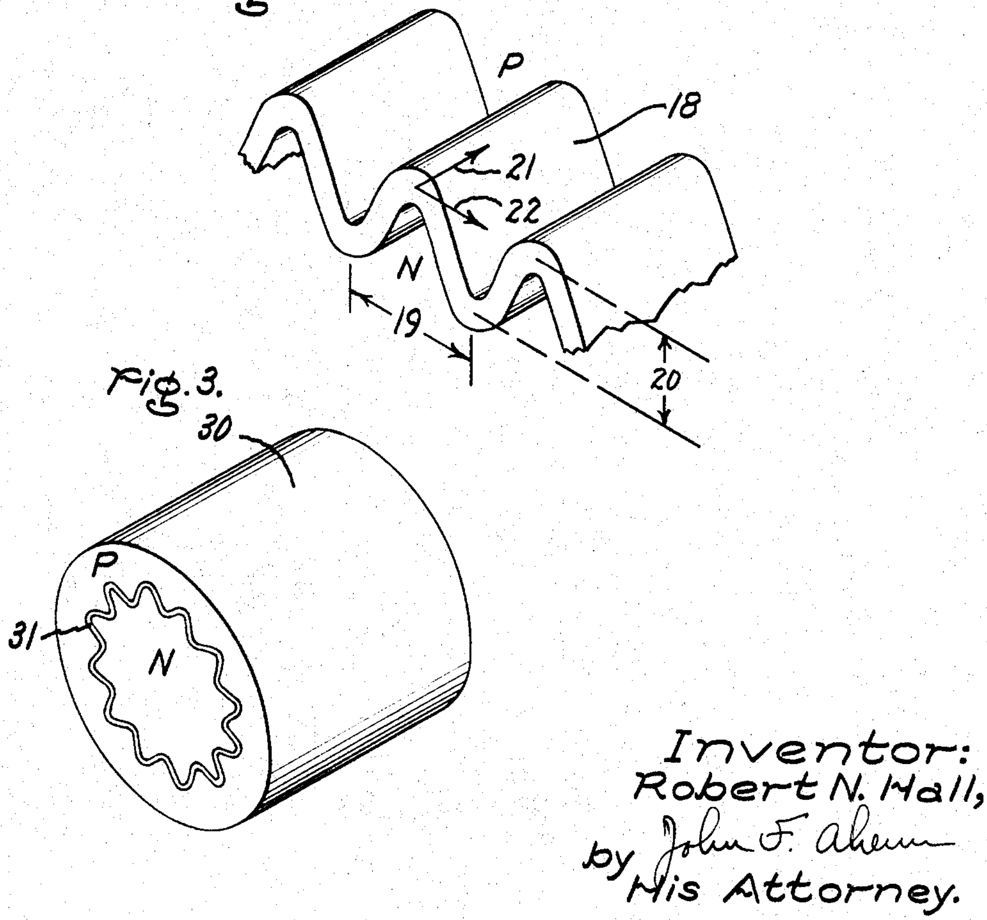

The novel features which are characteristic of the present invention are set forth with particularly in the appended claims. The invention itself, together with further objects and advantages thereof may best be understood with reference to the following detailed description taken in connection with the drawings in which:

FIGURE 1 is a perspective view of a typical device constructed in accord with the invention, FIGURE 2 is an enlarged view of a portion of the junction region of the device of FIGURE 1; and FIGURE 3 is a schematic drawing of an alternative configuration for devices in accord with the invention.

Semiconductor junction lasers have heretofore been disclosed with flat, or planar, junctions, and with curved junctions having a radius of curvature at least an order of magnitude longer than the effective absorption length of radiation in the semiconductive material. Junctions of the latter type are substantially similar to planar junctions insofar as the present invention is concerned.

FIGURE 1 of the drawing illustrates a semiconductor junction diode constructed in accord with the present invention and adapted for emitting stimulated coherent radiation. The device of FIGURE 1 comprises a crystal of direct electron transition semiconductive material indicated generally at 1 having a degenerately impregnated or doped P-type region 2 and a degenerately impregnated or doped N-type region 3. Non-rectifying contact is made between the P-type region 2 and a first electrode 5 by means of an acceptor type or electrically neutral solder layer 6 and a non-rectifying connection is made between N-type region 3 and a second electrode 7 by means of a donor type or electrically neutral solder layer 8. Electrode connectors 9 and 10 are connected to electrodes 5 and 7, respectively, as, for example, by welding, brazing, etc. Parallel reflecting surfaces 11 and 12 (Fabry-Perot faces) are adapted to sustain a standing electromagnetic wave between them in the junction region 18.

The semiconductor junction diode is activated to the emission of stimulated coherent radiation by the application of a forward bias, as for example, by the connection to a source of direct current of sufficiently high current capacity to cause the production of coherent radiation. Such a pulsed source is illustrated schematically as 15 and is connected to diode 1 through a series limiting resistor 16. Temperature control means can be provided to regulate the ambient temperature of diode 1 in order to vary the value of current at which the threshold of stimulated coherent emission is achieved.

In accord with the present invention, P-type region 2 and N-type region 3 are separated by a serpentine or sinuous P-N junction region 18 that extends linearly between Fabry Perot faces 11 and 12 but is sufficiently curved, as viewed in planes parallel to the aforementioned reflecting faces, so that any straight line drawn from a point in junction region 18 in a direction not substantially perpendicular to the aforementioned faces extends through a distance in either the P or N-type conductivity regions that is longer than the effective absorption length for radiation in these regions. Thus, spurious oscillations in modes transverse to the Fabry-Perot surfaces are prevented. The effective absorption length for any given frequency of radiation is that length wherein the radiation will be absorbed when traversing the given length by a factor $1/e$, where $e$ is the base of the Napierian logarithms.

Usually the first oscillation in a spurious mode occurs in the direction transverse to the primary mode. Accordingly, substantial benefit is derived from the teaching of the present invention by sufficiently curving the junction region so that any straight line drawn from the junction that is parallel to the Fabry-Perot faces passes through a distance externally of the junction region (in the P or N-type conductivity regions) that is longer than the effective absorption length for the radiation therein. While the length may be different in the N-type and P-type regions, it is sufficient for purpose of the present invention to take their average as the effective absorption length. For purposes of determining an appropriate curved configuration in accord with the present invention, it is generally found that the effective absorption length is typically 50 microns, though, of course, the precise length varies with temperature, impurities and semiconductive material. In degenerate gallium arsenide devices, for example, the effective absorption length for the wave length of coherent light emitted is approximately 50 microns at 77° K.

The junction region is fabricated, in accord with my invention, to provide a curvature based upon the known effective absorption length for the wave length of radiation emitted. Thus, when junction region 18 is in a gallium arsenide device, for example, and is shaped substantially as a plurality of cycles of sine wave, when viewed in planes parallel to the Fabry-Perot faces, an amplitude of from approximately .05 to 0.1 millimeter, and preferably about 0.1 millimeter, and a period of approximately 0.2 millimeter provide sufficient curvature in accord with the present teaching so that no linear portion of the junction transverse to the Fabry-Perot faces exceeds in length about 0.2 millimeter. Thus, oscillations in the spurious transverse mode are prevented even though the length of the junction transverse to the Fabry-Perot faces is two or more times the separation, or perpendicular distance, between the Fabry-Perot faces, as illustrated in FIGURE 1, to yield an increased junction area that increases the power capability of the device in the primary mode.

The period is shown in more detail in FIGURE 2, that is an enlargement of the junction region 18 of FIGURE 1. In FIGURE 2 the period is the distance 19 and the amplitude is defined as distance 20. Junction region 18 extends linearly in direction 21, that is perpendicular to Fabry-Perot faces 11 and 12. Direction 22, that is perpendicular to direction 21, extends transverse to direction 21. In the case of gallium arsenide, the curvature of junction 18 is selected so that a straight line of distance equal to the period 19, drawn from any point in junction 18 and extending in the direction 22 passes through a distance equal to or greater than the absorption length, 0.05 millimeter, into the P or N-type regions before re-entering the junction. Of course, the present invention is not limited to sine waveforms and extends equally to sawtooth, rectangular-wave and the like waveforms, or combinations thereof, that satisfy the above critical criterion. The descriptive word, "serpentine" as used herein and in the appended claims is intended to include all such waveforms, whether or not continuous functions and periodic, as illustrated in FIGURE 1.

FIGURE 3 illustrates an alternative embodiment wherein a substantially cylindrical crystal 30 provides the main body for the laser. The rectangular geometry of FIGURE 1 may be replaced by the cylindrical geometry of FIGURE 3. The Fabry-Perot faces, which sustain oscillations in the primary mode, are the end surfaces of the cylindrical crystal that are fabricated to be exactly parallel. In accord with the present invention the serpentine junction region 31 is curved, in the general shape of teeth on a gear, as viewed in planes parallel to the Fabry-Perot faces, to suppress oscillation in the circular mode.

While a number of methods are suitable for fabrication of the semiconductor junction lasers of the present invention, the following example is intended to illustrate a particularly simple and convenient method to those skilled in the art. A device as shown in FIGURE 1 is constructed by providing a flat wafer from a monocrystalline ingot of N-type gallium arsenide which is impregnated or doped with approximately $10^{18}$ atoms per cubic centimeter of tellurium. The impregnation is achieved, conveniently, by growth from a melt of gallium arsenide containing at least $5\times10^{18}$ atoms per cubic centimeter of tellurium to cause the resulting crystal to be degenerately N-type.

One horizontal surface of the wafer is shaped with a diamond abrasive cutting wheel to provide grooves having a depth corresponding to the desired junction amplitude and a distance between cuts that is equal to the desired period. Alternatively, the wafer can be shaped by honing with a grooved tool. The cuts are advantageously selected to be approximately 0.1 millimeter deep and spaced by about 0.2 millimeter. Thereafter, a P-N junction region is formed in the aforementioned horizontal surface by diffusing zinc into all surfaces of the wafer at a temperature of approximately 900° C. for approximately one half hour using an evacuated sealed quartz tube containing the gallium arsenide crystal and ten milligrams of zinc. The P-N junction so formed is approximately 0.05 millimeter below all surfaces of the crystal. The wafer is then cut and ground to remove all except the aforementioned scored horizontal surface. As cut, the wafer typically is 0.5 millimeter thick, 0.4 millimeter along the edges that are transverse to the direction in which the junction extends linearly and any desired length along the other edges that provides the required junction area to meet the output power capability desired.

The front and rear faces of the crystal, that are perpendicular to the direction of the scored lines, and transverse to the direction in which the junction extends linearly, are then polished to optical smoothness and to exact parallelism. With the aforementioned gallium arsenide crystal, acceptor solder 6 is an alloy of three weight percent zinc, the remainder being indium, donor solder 8 is of tin.

An alternative method for forming the curved junction region is to mask one horizontal surface of the wafer prior to impregnation with the opposite-type conductivity-determining impurity. For example, in the method just described, silicon monoxide (or other suitable masking, or passivating material) is evaporated in strips, as by shadow masking, on one horizontal surface of the wafer prior to impregnation with zinc. The strips are preferably selected to have both a width and spacing approximately equal to one half of the desired period of the serpentine junction.

In operation, the device of FIGURE 1 is subjected to a pulse of direct current at high current levels, as for example, of approximately 5000 to 50,000 amperes per square centimeter for a gallium arsenide diode. The pulse width to avoid overheating is conveniently kept to a level of approximately 1 to 10 microseconds.

There has been shown and described herein a semiconductor laser structure wherein the junction is curved in the direction transverse to the direction of oscillations in the primary mode in order to prevent oscillations in spurious modes, particularly that spurious mode which is transverse to the primary mode, and to suppress superradiance. In this way, the semiconductor junction diodes construced in accord with this invention can be constructed with a junction length in the direction parallel to the Fabry-Perot faces as long as required without the deleterious effects of spurious radiation reducing the efficiency of light generation.

While only certain preferred features of the invention have been shown by way of illustration, many modifications and changes will occur to those skilled in the art. For example, the junction laser device is not limited to the type having Fabry-Perot reflecting surfaces, but can as well utilize the reflector cavities described in my copending applications Ser. No. 345,884 or Ser. No. 345,886, both filed concurrently herewith. It is therefore, to be understood that the appended claims are intended to cover all such modifications and changes as fall within the true spirit and scope of the invention.

What I claim as new and desire to secure by Letters Patent of the United States is:

1. A semiconductive junction laser comprising: a body of crystalline semiconductive material having degenerate N-type and P-type regions, a narrow serpentine P-N junction region between and contiguous with said degenerate regions extending linearly in at least one direction, and a pair of parallel reflecting faces for establishing a standing wave of electromagnetic energy in said junction region in said direction; said junction region being sufficiently curved, as viewed in planes parallel to said faces, so that any straight line drawn from a point in said junction region parallel to said faces extends through a distance in at least one of said degenerate regions that is longer than the effective absorption length for said radiation in said degenerate region, so that spurious radiation is suppressed.

2. The laser of claim 1 wherein said junction is substantially in the form of a continuous periodic wave, as viewed in planes parallel to said faces, with an amplitude of from approximately 0.05 to 0.1 millimeter.

3. The laser of claim 2 wherein said periodic wave is approximately in the form of a sine wave and the period thereof is about 0.2 millimeter.

4. In a stimulated coherent emission semiconductor device including; a monocrystalline body of a direct transition semiconductive material; a first region within said body having degenerate N-type conductivity characteristics; a second region within said body having degenerate P-type conductivity characteristics; a P-N junction region located intermediate and contiguous with said first and second regions; at least two surface portions of said body being exactly perpendicular to said junction region and parallel with each other to permit a standing wave of electromagnetic energy to be established between said two surface portions through at least said junction region; and, contact means making non-rectifying electrical contact with each of said P and N-type regions and adapted to be connected to an electric current source of sufficient magnitude to forward bias said junction region and establish a population inversion therein to provide emission of stimulated coherent radiation through at least one of said surfaces; the improvement of: said junction region being sufficiently curved, as viewed in planes parallel to said surfaces, so that any straight line drawn from a point in said junction region parallel to said surfaces extends through a distance in at least one of said degenerate regions that is longer than the effective absorption length for said radiation in said degenerate region, so that spurious radiation is suppressed.

5. The laser of claim 4 wherein said distance is greater than approximately 0.05 millimeter and said semiconductive material consists essentially of gallium arsenide.

6. The laser of claim 4 wherein the length of said junction region transverse to said two surface portions is equal to more than two times the separation between said two surface portions.

7. A semiconductive junction laser comprising: a body of crystalline semiconductive material having a degenerate N-type region and a degenerate P-type region, a narrow serpentine P-N junction region located between and contiguous with said degenerate regions extending linearly in one direction, reflecting means for establishing a standing wave of electromagnetic energy in said P-N junction region in said one direction in response to electrical excitation of said regions, and means electrically connected to said body for providing said excitation; said junction region being sufficiently curved, as viewed in planes parallel to said reflecting means, so that any straight line drawn from a point in said junction region parallel to said reflecting means extends through a distance in at least one of said degenerate regions that is longer than the effective absorption length for said radiation in said degenerate region, so that spurious radiation is suppressed.

References Cited

UNITED STATES PATENTS 3,245,002 4/1966 Hall ______________ 331—94.5

JEWELL H. PEDERSEN, *Primary Examiner.*

E. S. BAUER, *Assistant Examiner.*